(12) United States Patent
Byun et al.

(10) Patent No.: US 12,033,803 B2
(45) Date of Patent: Jul. 9, 2024

(54) MULTILAYER CAPACITOR

(71) Applicant: SAMSUNG ELECTRO-MECHANICS CO., LTD., Suwon-si (KR)

(72) Inventors: Man Su Byun, Suwon-si (KR); Se Hun Park, Suwon-si (KR); Soo Hwan Son, Suwon-si (KR); Taek Jung Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 87 days.

(21) Appl. No.: 17/706,785

(22) Filed: Mar. 29, 2022

(65) Prior Publication Data
US 2023/0215648 A1 Jul. 6, 2023

(30) Foreign Application Priority Data
Dec. 31, 2021 (KR) .................. 10-2021-0194080

(51) Int. Cl.
*H01G 4/30* (2006.01)
*H01G 2/06* (2006.01)
(Continued)

(52) U.S. Cl.
CPC .............. *H01G 4/30* (2013.01); *H01G 2/065* (2013.01); *H01G 4/012* (2013.01);
(Continued)

(58) Field of Classification Search
CPC ...... H01G 4/1209; H01G 4/232; H01G 2/065; H01G 2/02; H01G 4/012; H01G 4/30;
(Continued)

(56) References Cited

U.S. PATENT DOCUMENTS

2013/0033836 A1* 2/2013 Hattori .................. H01G 4/232
361/768
2013/0284507 A1* 10/2013 Hattori .................. H05K 1/181
174/260
(Continued)

FOREIGN PATENT DOCUMENTS

JP 2020-181962 A 11/2020
KR 10-2019-0121205 A 10/2019
KR 10-2020-0016586 A 2/2020

*Primary Examiner* — Michael P McFadden
(74) *Attorney, Agent, or Firm* — MORGAN, LEWIS & BOCKIUS LLP

(57) ABSTRACT

A multilayer capacitor includes: a body including a stack structure in which at least one first internal electrode and at least one second internal electrode are alternately stacked on each other having at least one dielectric layer interposed therebetween in a first direction; first and second external electrodes disposed on the body while being spaced apart from each other to be respectively connected to first internal electrode and second internal electrode; and first and second bumps respectively having one surfaces disposed on the first or second external electrode and including at least one hole positioned in the one surface or the other surface, wherein $A_V$ indicates a total area of the at least one hole, $A_B$ indicates an area of the one surface of the first or second bump, facing the first or second external electrode, and $A_V/A_B$ is greater than 0.012 and less than 0.189.

22 Claims, 18 Drawing Sheets

(51) Int. Cl.
   *H01G 4/012*  (2006.01)
   *H01G 4/12*   (2006.01)
   *H05K 1/11*   (2006.01)

(52) U.S. Cl.
   CPC .......... *H01G 4/1218* (2013.01); *H05K 1/111*
            (2013.01); *H05K 2201/10015* (2013.01)

(58) Field of Classification Search
   CPC ................ H01G 4/1218; H05K 1/111; H05K
                                              2201/10015
   See application file for complete search history.

(56)            References Cited

U.S. PATENT DOCUMENTS

| | | | |
|---|---|---|---|
| 2013/0329389 A1* | 12/2013 | Hattori | H01G 4/232 |
| | | | 361/782 |
| 2014/0116768 A1* | 5/2014 | Hattori | H01G 4/228 |
| | | | 174/260 |
| 2015/0096792 A1* | 4/2015 | Ogawa | H05K 3/303 |
| | | | 174/255 |
| 2015/0131253 A1* | 5/2015 | Park | H01G 2/06 |
| | | | 361/782 |
| 2015/0282326 A1* | 10/2015 | Hattori | H05K 1/141 |
| | | | 174/260 |
| 2016/0007446 A1* | 1/2016 | Ishikawa | H05K 1/113 |
| | | | 361/301.4 |
| 2016/0088735 A1* | 3/2016 | Park | H05K 1/181 |
| | | | 361/782 |
| 2018/0096794 A1* | 4/2018 | Morita | H01G 4/38 |
| 2020/0051746 A1 | 2/2020 | Park et al. | |
| 2020/0118745 A1 | 4/2020 | Ji et al. | |
| 2020/0343048 A1 | 10/2020 | Yokomizo | |

\* cited by examiner

A-A'

B-B'

MULTILAYER CAPACITOR

CROSS-REFERENCE TO RELATED APPLICATION(S)

This application claims benefit of priority to Korean Patent Application No. 10-2021-0194080 filed on Dec. 31, 2021 in the Korean Intellectual Property Office, the disclosure of which is incorporated herein by reference in its entirety.

TECHNICAL FIELD

The present disclosure relates to a multilayer capacitor.

BACKGROUND

A multilayer capacitor has been widely used as a component of an electronic device such as a computer, a personal digital assistant (PDA), a mobile phone because the multilayer capacitor has a small size, implements high capacitance and may be easily mounted, and has also been widely used as a component of an electric device (including a vehicle) because the multilayer capacitor has high reliability and high strength characteristics.

The dielectric material having high dielectric constant, which may be used for the multilayer capacitor, may also have a piezoelectric property, and the multilayer capacitor may thus be vibrated minutely when voltage is applied thereto. The minute vibrations occurring in the multilayer capacitor may be transmitted to a board that may be connected to the multilayer capacitor, and noise may thus occur from the board due to the vibrations transmitted thereto. Here, the noise may be referred to as acoustic noise.

The acoustic noise may stimulate the hearing of a user using the electronic device/electric device including the board, and the user may thus believe that the electronic device/electric device has malfunctioned due to the noise. In addition, the acoustic noise may reduce an acoustic input/output performance when the electronic device/electric device provides the acoustic input/output, and may act as the noise on a sensor of the electronic device/electric device, thereby lowering sensitivity of the sensor. Accordingly, acoustic noise reduction may be required as one of various performances of the multilayer capacitor.

A structure of a path through which the vibrations of the multilayer capacitor are transmitted to another structure (e.g., board or electronic device/electric device) connected to the multilayer capacitor may have an effect not only on the acoustic noise, but also adhesion strength between the multilayer capacitor and another structure connected thereto. Operational reliability of the electronic device/electric device using the multilayer capacitor may be increased as the adhesion strength is increased, and accordingly, the stronger the adhesion strength, the more advantageous the multilayer capacitor is to be used in a variety of electronic and electric devices.

SUMMARY

An aspect of the present disclosure may provide a multilayer capacitor having improved efficiency (e.g., reduced acoustic noise or improved adhesion strength) of a connection structure with respect to another structure (e.g., board or electronic device/electric device) connected thereto.

According to an aspect of the present disclosure, a multilayer capacitor may include: a body including a stack structure in which at least one first internal electrode and at least one second internal electrode are alternately stacked on each other having at least one dielectric layer interposed therebetween in a first direction; first and second external electrodes disposed on the body while being spaced apart from each other to be respectively connected to the at least one first internal electrode and the at least one second internal electrode; and first and second bumps respectively having one surface disposed on the first or second external electrode and including at least one hole positioned in the one surface or the other surface, wherein $A_V$ indicates a total area of the at least one hole, $A_B$ indicates an area of the one surface of the first or second bump, facing the first or second external electrode, and $A_V/A_B$ is greater than 0.012 and less than 0.189.

According to another aspect of the present disclosure, a multilayer capacitor may include: a body including a stack structure in which at least one first internal electrode and at least one second internal electrode are alternately stacked on each other having at least one dielectric layer interposed therebetween in a first direction; first and second external electrodes disposed on the body while being spaced apart from each other to be respectively connected to the at least one first internal electrode and the at least one second internal electrode; and first and second bumps respectively having one surface disposed on the first or second external electrode and including at least one hole positioned in the one surface or the other surface, wherein the first and second bumps each include a recess portion recessed in a direction different from a direction in which the one surface of the first or second bump and the other surface of the first or second bump face each other, and a total area of the at least one hole is smaller than a total area of the recess portion.

According to another aspect of the present disclosure, a multilayer capacitor may include: a body including a stack structure in which at least one first internal electrode and at least one second internal electrode are alternately stacked on each other having at least one dielectric layer interposed therebetween in a first direction; first and second external electrodes disposed on the body while being spaced apart from each other to be respectively connected to the at least one first internal electrode and the at least one second internal electrode; and first and second bumps respectively having one surface disposed on the first or second external electrode and including a plurality of holes positioned in the one surface or the other surface, wherein each hole is spaced apart from an adjacent hole.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Figure 1:
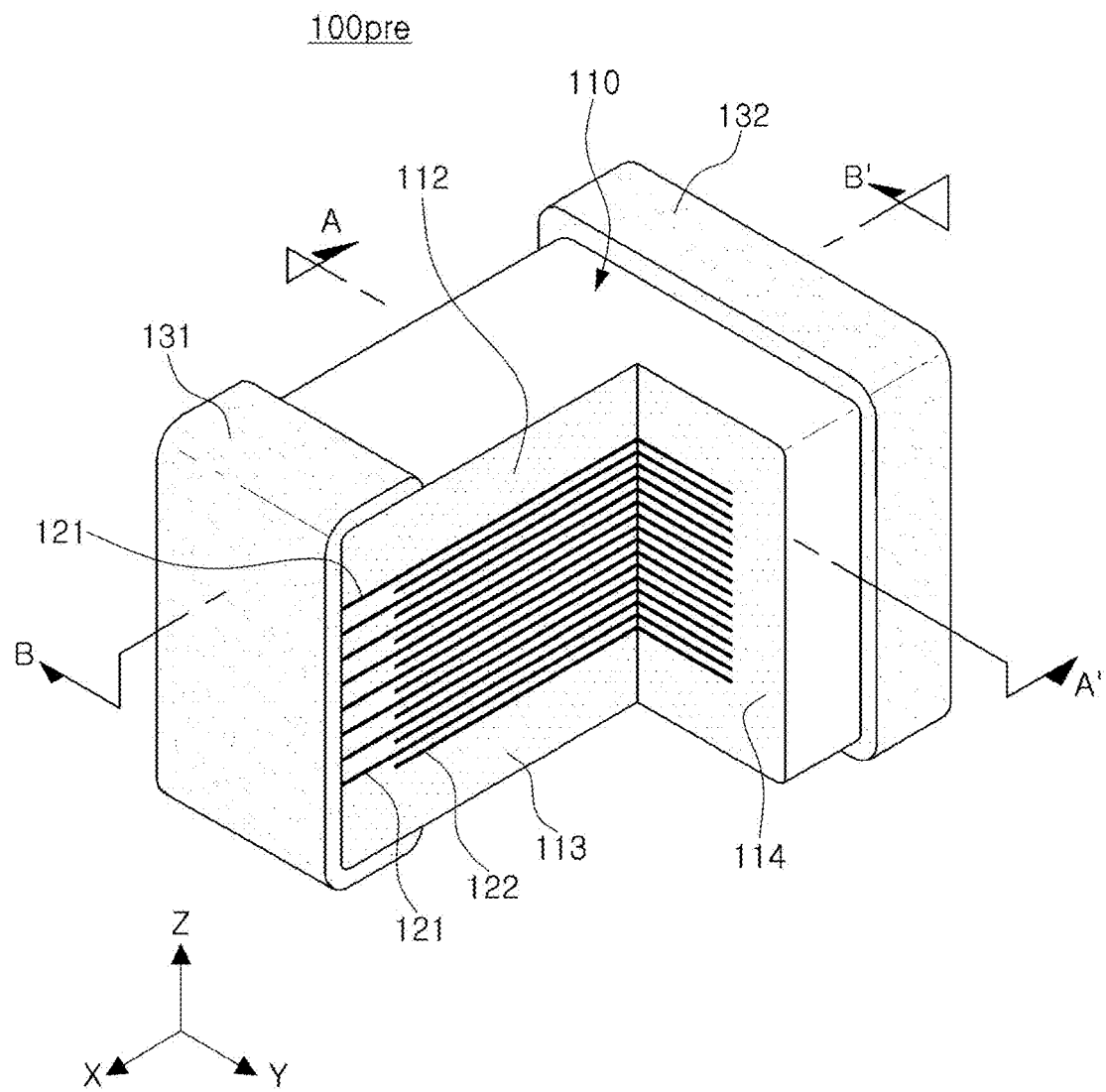
FIG. 1 is a perspective view showing a portion of a multilayer capacitor according to an exemplary embodiment of the present disclosure.

Hereinafter, exemplary embodiments of the present disclosure will now be described in detail with reference to the accompanying drawings.

In order to clearly describe exemplary embodiments of the present disclosure, directions of a hexahedron may be defined as follows: an X-direction, a Y-direction and a Z-direction in the drawings respectively refer to a length direction, a width direction and a thickness direction. Here, the thickness direction may refer to a stacking direction (or first direction) in which dielectric layers are stacked on each other.

Hereinafter, the description describes a multilayer capacitor according to an exemplary embodiment of the present disclosure, and in particular, a multi-layer ceramic capacitor (MLCC). However, the present disclosure is not limited thereto.

Figure 2:
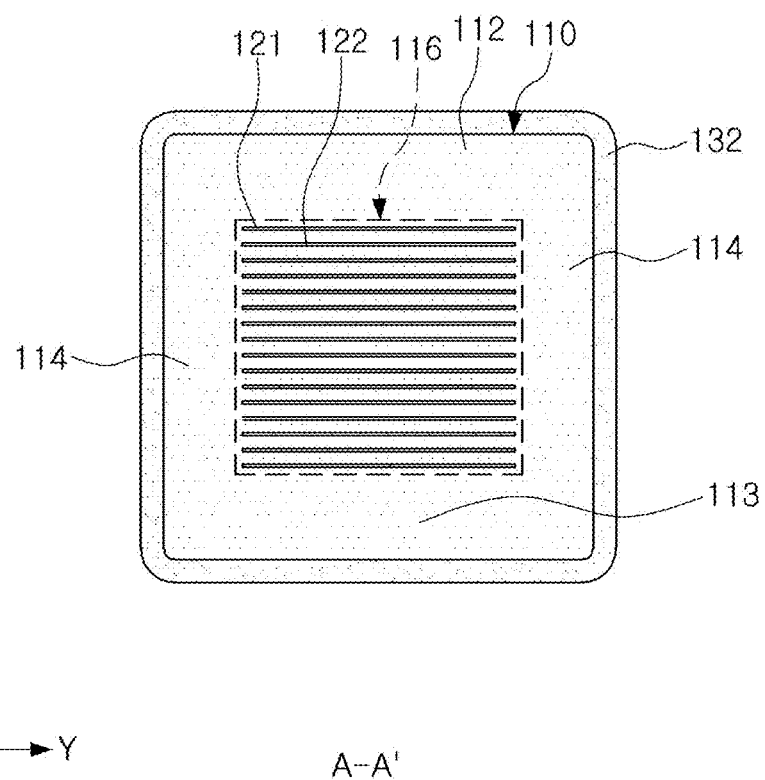
FIG. 2 is a cross-sectional view taken along line A-A' of FIG. 1.

FIG. 1 is a perspective view showing a portion of the multilayer capacitor according to an exemplary embodiment of the present disclosure; FIG. 2 is a cross-sectional view taken along line A-A' of FIG. 1; and FIG. 3 is a cross-sectional view taken along line B-B' of FIG. 1.

Figure 3:
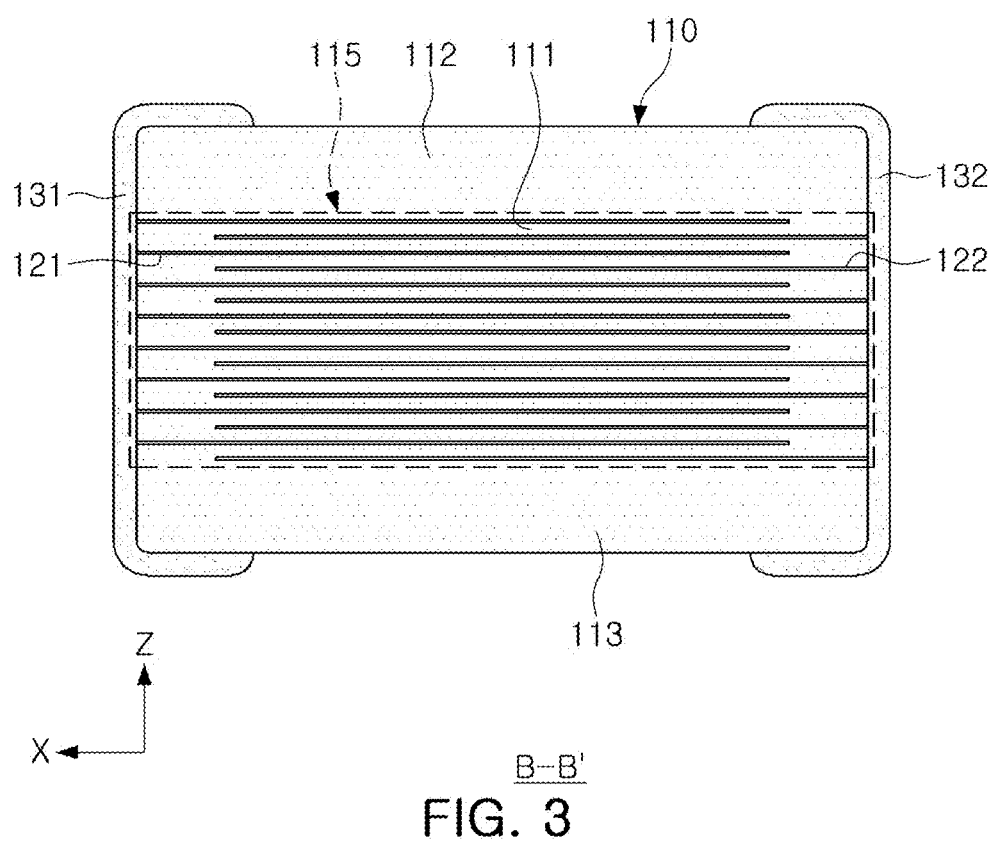
FIG. 3 is a cross-sectional view taken along line B-B' of FIG. 1.

Referring to FIGS. 1, 2 and 3, a portion 100pre of the multilayer capacitor according to an exemplary embodiment of the present disclosure may include a body 110, a first external electrode 131 and a second external electrode 132.

The body 110 may include a stack structure in which at least one first internal electrode 121 and at least one second internal electrode 122 are alternately stacked on each other interposing at least one dielectric layer 111 therebetween in a first direction (e.g., Z direction).

For example, the body 110 may be a ceramic body formed by sintering the stack structure. Here, the at least one dielectric layer 111 disposed in the body 110 may be in a fired state, and a boundary between the adjacent dielectric layers may be integrated to each other, thus making it difficult to confirm a boundary therebetween without using a scanning electron microscope (SEM).

For example, the body 110 may have a shape of a hexahedron having two side surfaces in the length direction (X-direction), two side surfaces in the width direction (Y-direction) and two side surfaces in the thickness direction (Z-direction), and this hexahedron may have edges/corners polished to each have a round shape. However, the shape and dimension of the body 110 and the stack number of the dielectric layers 111 may not be limited to those described in this exemplary embodiment.

The at least one dielectric layer 111 may have a thickness arbitrarily changed based on a capacitance design of the portion 100pre of the multilayer capacitor, and may include a ceramic powder having high dielectric constant, e.g., barium titanate ($BaTiO_3$) based powder. However, the present disclosure is not limited thereto. In addition, various ceramic additives (e.g., $MgO$, $Al_2O_3$, $SiO_2$ or $ZnO$), organic solvents, plasticizers, binders, dispersants or the like may be added to the ceramic powder based on a required specification of the portion 100pre of the multilayer capacitor.

An average particle diameter of the ceramic powder used to form the at least one dielectric layer 111 may not be particularly limited, may be adjusted based on the required specification of the portion 100pre of the multilayer capacitor (e.g., miniaturization and/or high capacitance required for a capacitor for an electronic device, or high withstand voltage characteristic and/or strong strength required for a capacitor for an electric device), and may be adjusted to 400 nm or less for example.

For example, the at least one dielectric layer 111 may be formed by applying a slurry including a powder formed of a material such as barium titanate ($BaTiO_3$) or the like, to a carrier film and then drying the same to prepare a plurality of ceramic sheets. The ceramic sheets may be formed by mixing the ceramic powder, a binder and a solvent with one another to prepare the slurry and then forming the slurry in a shape of the sheet having a thickness of several micrometers using a doctor blade method, and the present disclosure is not limited thereto.

The at least one first internal electrode 121 and the at least one second internal electrode 122 may be formed as follows: conductive pastes each including a conductive metal are printed; arranged along the stacking direction (e.g., Z direction) of the dielectric layer to be alternately exposed to one side surface and the other side surface of the body 110 in the length direction (X-direction) of the body 110; and electrically insulated from each other by the dielectric layer interposed therebetween.

For example, the at least one first internal electrode 121 and the at least one second internal electrode 122 may each be formed of a conductive paste for an internal electrode, having an average particle size of 0.1 to 0.2 μm, and including 40 to 50 wt % of conductive metal powder, and the present disclosure is not limited thereto. The conductive paste may include single metal powder such as nickel (Ni), copper (Cu), palladium (Pd), silver (Ag), lead (Pb) or platinum (Pt), or alloys thereof, and the present disclosure is not limited thereto.

For example, the conductive paste for an internal electrode may be applied to the ceramic sheets using a printing method or the like, to form an internal electrode pattern. The printing method of the conductive paste may be a screen-printing method, a gravure printing method, an inkjet printing method or the like, and the present disclosure is not limited thereto. For example, two hundred or three hundred ceramic sheets on each of which the internal electrode pattern is printed may be stacked, pressed and sintered to manufacture the body 110.

A capacitance of the portion 100pre of the multilayer capacitor may be proportional to an area in which the at least one first internal electrode 121 and the at least one second internal electrode 122 overlap each other in the stacking direction (e.g., the Z direction), proportional to a total stack number of the at least one first internal electrode 121 and the at least one second internal electrode 122, and inversely proportional to a distance between the at least one first internal electrode 121 and the at least one second internal electrode 122. The distance may be substantially equal to each thickness of the at least one dielectric layer 111.

The portion 100pre of the multilayer capacitor may have a higher capacitance compared to a thickness thereof as the distance between the at least one first internal electrode 121 and the at least one second internal electrode 122 is smaller. On the other hand, a withstand voltage of the portion 100pre of the multilayer capacitor may be higher as the distance is increased. Therefore, the distance may be adjusted based on the required specification of the portion 100pre of the multilayer capacitor (e.g., miniaturization and/or high capacitance required for a capacitor for an electronic device, or high withstand voltage characteristic and/or strong strength required for a capacitor for an electric device). Each thickness of the at least one first internal electrode 121 and the at least one second internal electrode 122 may also be changed based on the above distance.

For example, the portion 100pre of the multilayer capacitor may be designed so that the distance between the at least one first internal electrode 121 and the at least one second internal electrode 122 are greater than twice the thickness of each electrode when required to have the high withstand voltage characteristic and/or the strong strength. For example, the portion 100pre of the multilayer capacitor may be designed so that each thickness of the at least one first internal electrode 121 and the at least one second internal electrode 122 is 0.4 μm or less and the total stack number thereof is 400 or more when required to have the miniature size and/or the high capacitance.

The first and second external electrodes 131 and 132 may be disposed on the body 110 while being spaced apart from each other to be respectively connected to the at least one first internal electrode 121 and the at least one second internal electrode 122.

For example, the first and second external electrodes 131 and 132 may each be formed using a method of dipping the external electrodes into a paste including a metal component, a method of printing the conductive paste, a sheet transfer method, a pad transfer method, a sputter plating method, an electrolytic plating method, etc. For example, the first and second external electrodes 131 and 132 may each include a fired layer formed by firing the paste and a plating layer formed on an outer surface of the fired layer, and may further include a conductive resin layer disposed between the fired layer and the plating layer. For example, the conductive resin layer may be formed as a thermosetting resin such as epoxy includes a conductive particle. The metal component may be a single component such as copper (Cu), palladium (Pd), platinum (Pt), gold (Au), silver (Ag), lead (Pb) or tin (Sn), or alloys thereof, and the present disclosure is not limited thereto.

The portion 100pre of the multilayer capacitor may be mounted or embedded in an external board (e.g., printed circuit board), and may be connected to at least one of the wiring, land, solder and bump of the external board through the first and second external electrodes 131 and 132 to be electrically connected to a circuit (e.g., integrated circuit or processor) electrically connected to the external board.

Referring to FIGS. 1, 2 and 3, the body 110 may include an upper cover layer 112, a lower cover layer 113 and a core region 115, and the core region 115 may include a margin region 114 and a capacitance region 116.

The upper and lower cover layers 112 and 113 may be disposed to interpose the core region 115 therebetween in the first direction (e.g., Z direction) and may each have a thickness greater than that of the at least one dielectric layer 111.

Each of the upper and lower cover layers 112 and 113 may prevent an external environmental factor (e.g., moisture, plating solution or foreign material) from infiltrating into the core region 115, may protect the body 110 from external impact, and may also improve a bending strength of the body 110.

For example, the upper and lower cover layers 112 and 113 may each include the same material or a different material (e.g., thermosetting resin such as epoxy resin) from the at least one dielectric layer 111.

The capacitance region 116 may include a portion between the at least one first internal electrode 121 and the at least one second internal electrode 122, thus forming the capacitance of the portion 100pre of the multilayer capacitor.

The capacitance region 116 may include the stack structure in which the at least one first internal electrode 121 and the at least one second internal electrode 122 are alternately stacked on each other interposing the at least one dielectric layer 111 therebetween in the first direction (e.g., Z direction), and may have the same size as the stack structure.

The margin region 114 may be a portion between each boundary line of the at least one first internal electrode 121 and the at least one second internal electrode 122 and the surface of the body 110.

The plurality of margin regions 114 may be disposed to interpose the capacitance region 116 therebetween in a second direction (e.g., the Y direction) perpendicular to the first direction (e.g., the Z direction). For example, the plurality of margin regions 114 may be formed in a manner similar to that of the at least one dielectric layer 111 (however, in a different stacking direction).

The plurality of margin regions 114 may prevent the at least one first internal electrode 121 and the at least one second internal electrode 122 from being exposed from the surface of the body 110 in the second direction (e.g., the Y direction), and may thus prevent the external environmental factor (e.g., moisture, plating solution or foreign material) from infiltrating into the at least one first internal electrode 121 and the at least one second internal electrode 122 through the surface of the body in the second direction, thereby improving the reliability and lifespan of the portion 100pre of the multilayer capacitor. In addition, the at least one first internal electrode 121 and the at least one second internal electrode 122 may each be efficiently expanded in the second direction due to the plurality of margin regions 114, and the plurality of margin regions 114 may thus allow the area in which the at least one first internal electrode 121 and the at least one second internal electrode 122 overlap to each other to be increased, thereby contributing to improvement in capacitance of the portion 100pre of the multilayer capacitor.

Figure 4A:
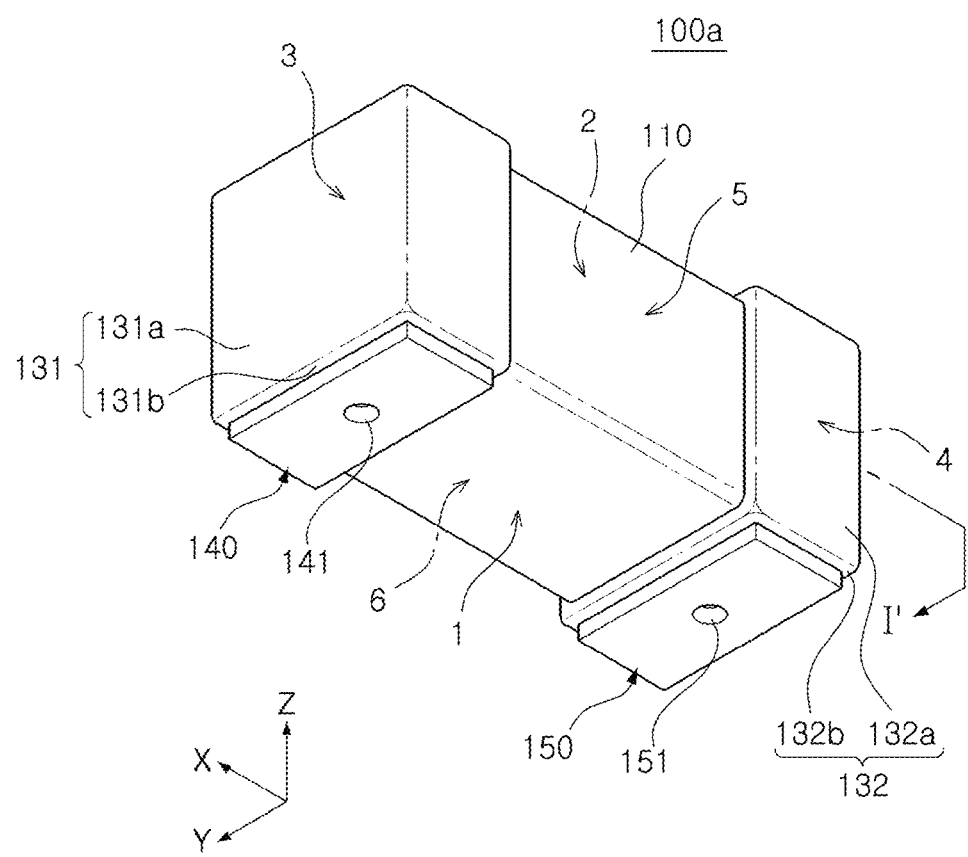
FIGS. 4A through 4C are perspective views each showing the multilayer capacitor according to an exemplary embodiment of the present disclosure.
Figure 4B:
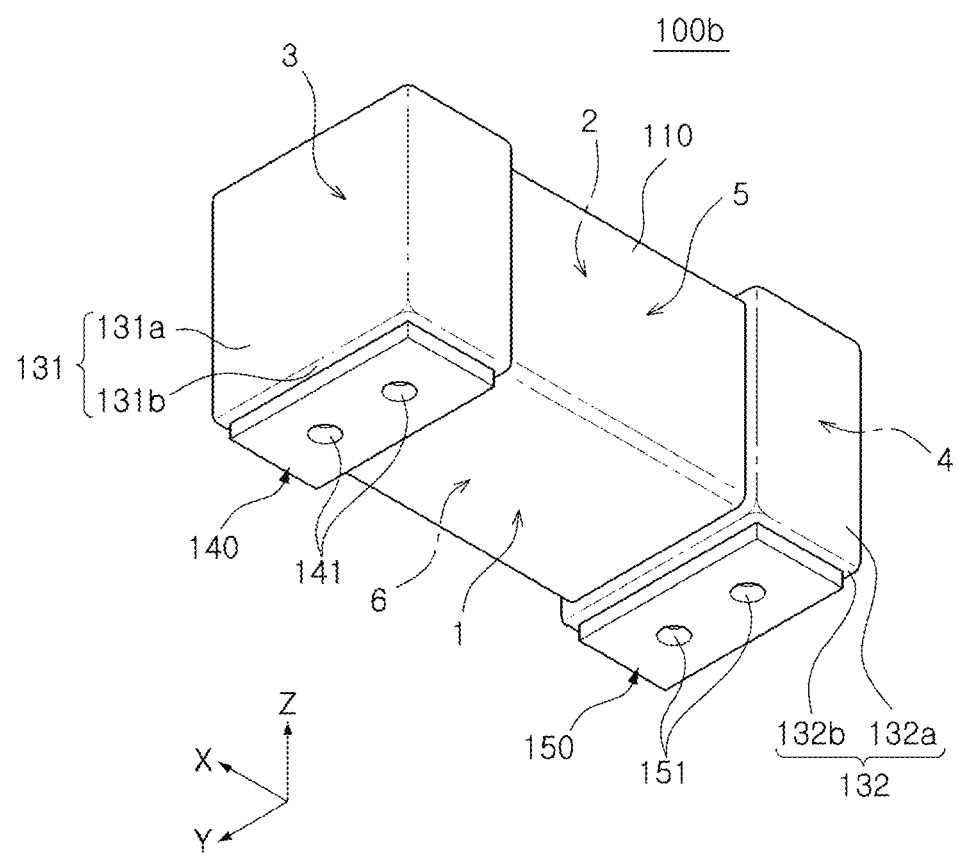
Figure 4C:
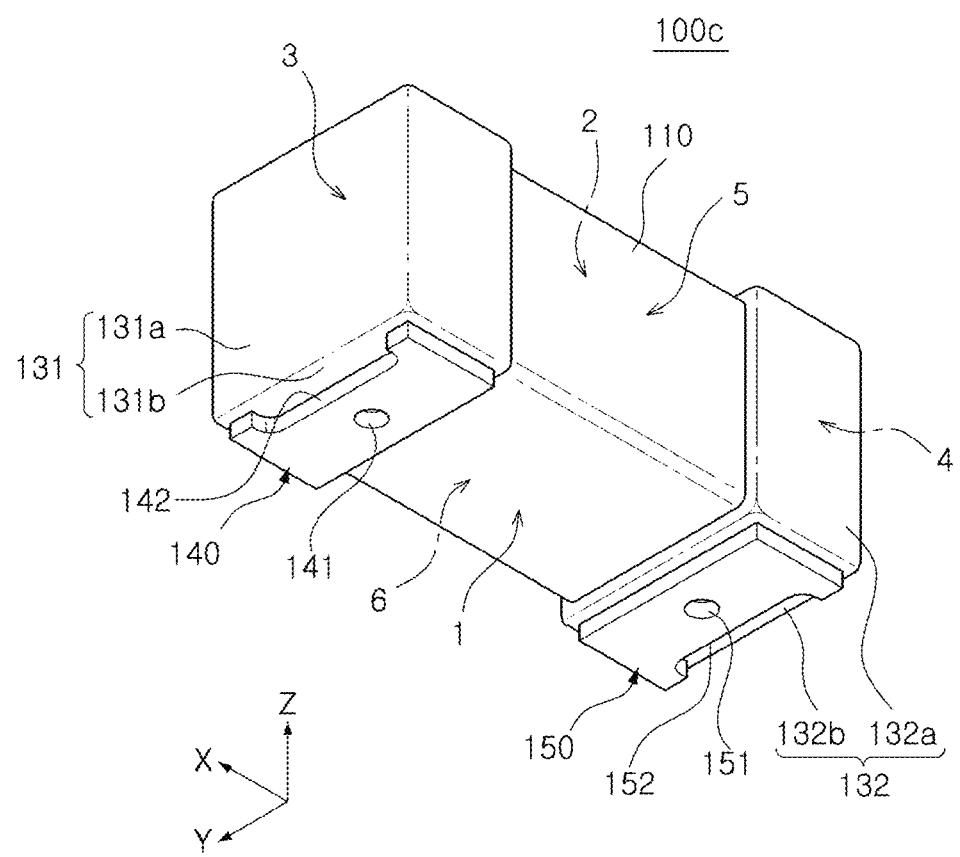

FIGS. 4A through 4C are perspective views each showing the multilayer capacitor according to an exemplary embodiment of the present disclosure.

Referring to FIG. 4A through 4C, multilayer capacitors 100a, 100b and 100c according to an exemplary embodiment of the present disclosure may each include the body 110, the first and second external electrodes 131 and 132, a first bump 140 and a second bump 150.

The body 110 may have the shape of a hexahedron including first, second, third, fourth, fifth and sixth surfaces 1, 2, 3, 4, 5 and 6, and the present disclosure is not limited thereto. Here, the first surface 1 may be a surface facing another structure (e.g., a board, an electronic device/electric device) to which the multilayer capacitors 100a, 100b or 100c is connected. The third or fourth surface 3 or 4 may be a surface of the body 110, on which the at least one first internal electrode or the at least one second internal electrode is connected to the first or second external electrode 131 or 132, and may not be parallel to the first surface 1. The first surface 1 may be parallel to one surface (e.g., upper surface) of each of the first and second bumps 140 and 150.

The first and second external electrodes 131 and 132 may each include connection portions 131a and 132a each disposed on the third and fourth surfaces 3 and 4, and may each include bend portions 131b and 132b disposed on the first surface 1. The connection portions 131a and 132a may be connected to the internal electrodes of the body 110, the bend portions 131b and 132b may each be connected to the first and second bumps 140 and 150, and the first and second external electrodes 131 and 132 may thus connect between the internal electrode of the body 110 and the first and second bumps 140 and 150.

The first bump 140 may have one surface (e.g., its upper surface based on the Z-direction) disposed on one surface of the first external electrode 131 (e.g., its bottom surface based on the Z-direction), and the second bump 150 may have one surface (e.g., an upper surface thereof based on the Z-direction) disposed on one surface of the second external electrode 132 (e.g., a bottom surface thereof based on the Z-direction).

The first and second bumps 140 and 150 may be disposed between the multilayer capacitor 100a, 100b or 100c and the structure (e.g., board or electronic device/electric device) connected to the capacitor, and may thus support the multilayer capacitor 100a, 100b or 100c on this connection structure. Accordingly, the first and second bumps 140 and 150 may each be at least a portion of a path through which vibration is transmitted between the body 110 and another structure (e.g., board or electronic device/electric device), and may thus have an effect on the acoustic noise of the multilayer capacitor 100a, 100b or 100c and/or the adhesion strength between the capacitor and another structure.

The first and second bumps 140 and 150 may be manufactured by being separated from a portion of the multilayer capacitor shown in FIGS. 1 through 3, and then respectively disposed on the first and second external electrodes 131 and 132. Therefore, the first and second bumps 140 and 150 may be designed relatively more freely as compared to the first and second external electrodes 131 and 132, and it is thus more advantageous for designing the capacitor to have reduced acoustic noise and improved adhesion strength. Depending on the design, the first and second bumps 140 and 150 may respectively be adhered to the first and second external electrodes 131 and 132 through a conductive adhesive layer (e.g., solder having a high melting point or conductive paste).

The first and second bumps 140 and 150 may each include a metal material, thus electrically connecting the multilayer capacitors 100a, 100b and 100c and the structure connected thereto. For example, the first and second bumps 140 and 150 may each have a shape of a cuboid including copper (Cu) and having a surface on which a nickel (Ni) plating layer and a tin (Sn) plating layer are disposed.

The multilayer capacitor 100a, 100b or 100c may be adhered to another structure (e.g., board or electronic device/electric device) through the solder, and the solder may be connected to the first and second external electrode 131 or 132 and the first or second bump 140 and 150 to allow the external electrode and the bump to be adhered to each other by a reflow process in a state where the multilayer capacitor 100a, 100b or 100c is positioned on a pad of another structure. The solder may have a melting point lower than that of copper (Cu) which may be included in the first or second bump 140 or 150, and may include tin (Sn) or a tin-based alloy.

A portion of the solder may be formed up a side surface of the first or second external electrode 131 or 132, a width of a path between the first or second external electrode 131 or 132 and another structure may be widened, and an acoustic impedance of the path may be reduced. As the acoustic impedance of the path is reduced, the vibration of the body 110 may be transmitted more to another structure, thereby increasing the acoustic noise.

The first bump 140 may include a first hole 141 in one surface or the other surface (e.g., its bottom surface based on the Z-direction), and the second bump 150 may include a second hole 151 in one surface or the other surface of (e.g., its bottom surface based on the Z-direction). The first or second bump 140 or 150 may include at least one hole 141 or 151.

Accordingly, a portion of the solder may be accommodated in the at least one hole 141 or 151 instead of climbing up the side surface of the first or second external electrode 131 or 132, thus reducing the width between the multilayer capacitor 100a, 100b or 100c and another structure, increasing the acoustic impedance, and reducing the acoustic noise.

For example, a space positioned between the first and second bumps 140 and 150 may include air. A portion of the solder may thus be disposed not only on the at least one hole 141 or 151, but also on a portion of the empty space between the first and second bumps 140 and 150. Accordingly, the solder may have a further reduced height at which the solder climbs up the first and second external electrodes 131 and 132, and acoustic noise may be further reduced.

Referring to FIG. 4B, the first and second bumps 140 or 150 of the multilayer capacitor 100b according to an exemplary embodiment of the present disclosure may each include two or more holes classified as the at least one hole 141 or 151.

Accordingly, the at least one hole 141 or 151 may be advantageously disposed closer to an edge of the first or second bump 140 or 150 so that the solder outside the first or second bump 140 or 150 is moved efficiently to the at least one hole 141 or 151. In addition, when a radius of the at least one hole 141 is different from that of the at least one hole 151, a total area of the at least one hole 141 or 151 may be adjusted more precisely.

Referring to FIG. 4C, the first and second bumps 140 and 150 of the multilayer capacitor 100c according to an exemplary embodiment of the present disclosure may each include a recess portion 142 or 152 recessed in the direction (e.g., X-direction) different from a direction (e.g., Z direction) in which the one surface (e.g., upper surface) of the first or second bump 140 or 150 and the other surface (e.g., lower surface) of the first or second bump 140 or 150 face each other. For example, the recess portion may be recessed in a direction orthogonal to the first direction.

The recess portion 142 or 152 may provide a space accommodating a portion of the solder, which is supposed to climb up the side surface of the first or second external electrode 131 or 132, thereby reducing the acoustic noise.

A path through which the solder is moved to be accommodated in the recess portion 142 or 152 and the path through which the solder is moved to be accommodated in the at least one hole 141 or 151 may be different from each other. Therefore, a combination of the recess portion 142 or 152 and the at least one hole 141 or 151 may increase a variety of paths through which the solder is accommodated, thereby further increasing efficiency in accommodating the solder and more effectively reducing the acoustic noise. For example, the at least one hole 141 or 151 may be positioned to be biased from a center of the first or second bump 140 or 150 in a direction in which the holes face each other (i.e., inside of the bump, based on the X-direction). In some embodiments, at least one hole 141 or 151 may have a central axis that is offset from a center of the first or second bump. The central axis may be along the first direction.

Compared to the recess portion 142 or 152, the at least one hole 141 or 151 may increase a contact area between the solder and the first or second bump 140 or 150 compared to its unit area, and at least one hole 141 or 151 may thus more efficiently improve the adhesion strength between the first or second bump 140 or 150 and another structure (e.g., board or electronic device/electric device) by the increased contact area.

Accordingly, the total area of the at least one hole 141 or 151 may be smaller than a total area of the recess portion 142 or 152, thereby efficiently improving overall acoustic noise reduction performance and adhesion strength increase performance.

FIGS. 5A through 5G are side views each showing the multilayer capacitor according to an exemplary embodiment of the present disclosure.

Figure 5A:
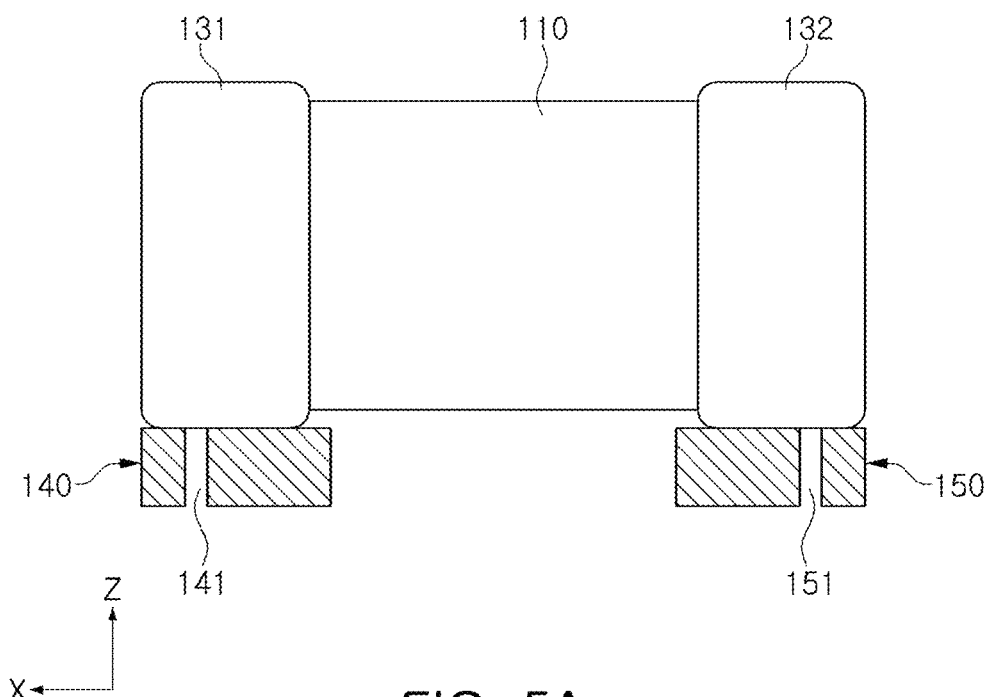
FIGS. 5A through 5G are side views each showing the multilayer capacitor according to an exemplary embodiment of the present disclosure.
Figure 5B:
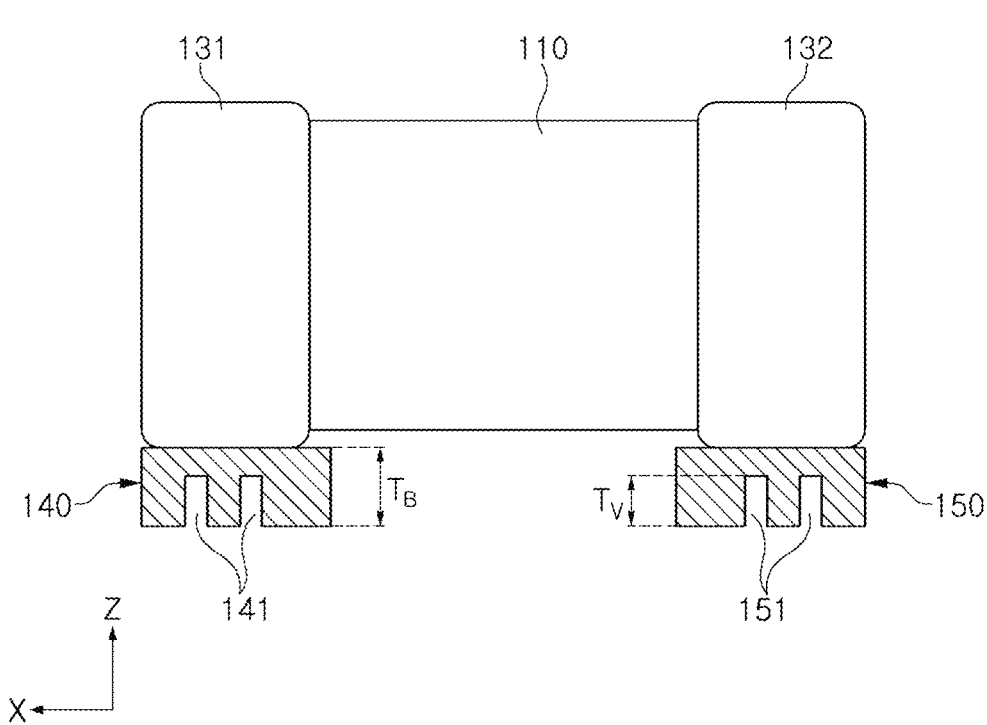
Figure 5C:
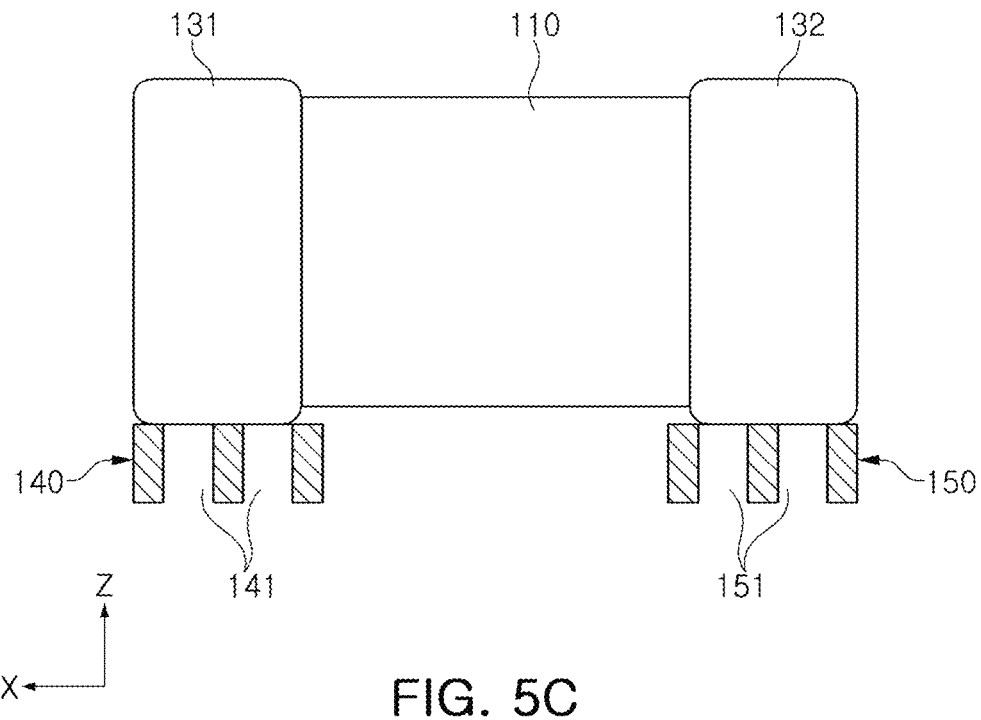
Figure 5D:
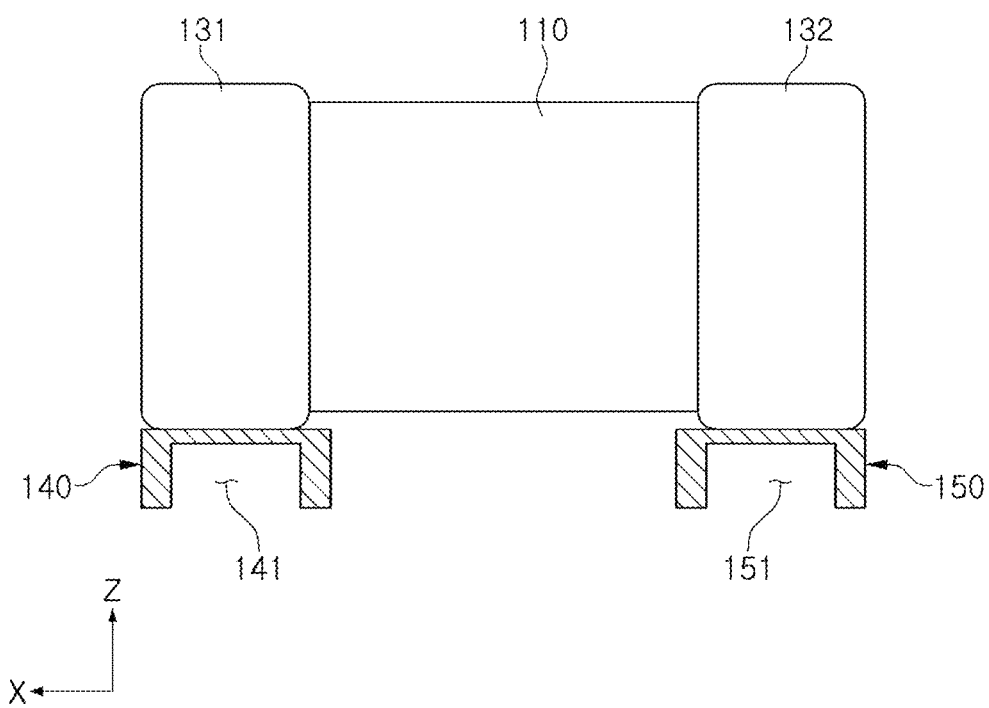
Figure 5E:
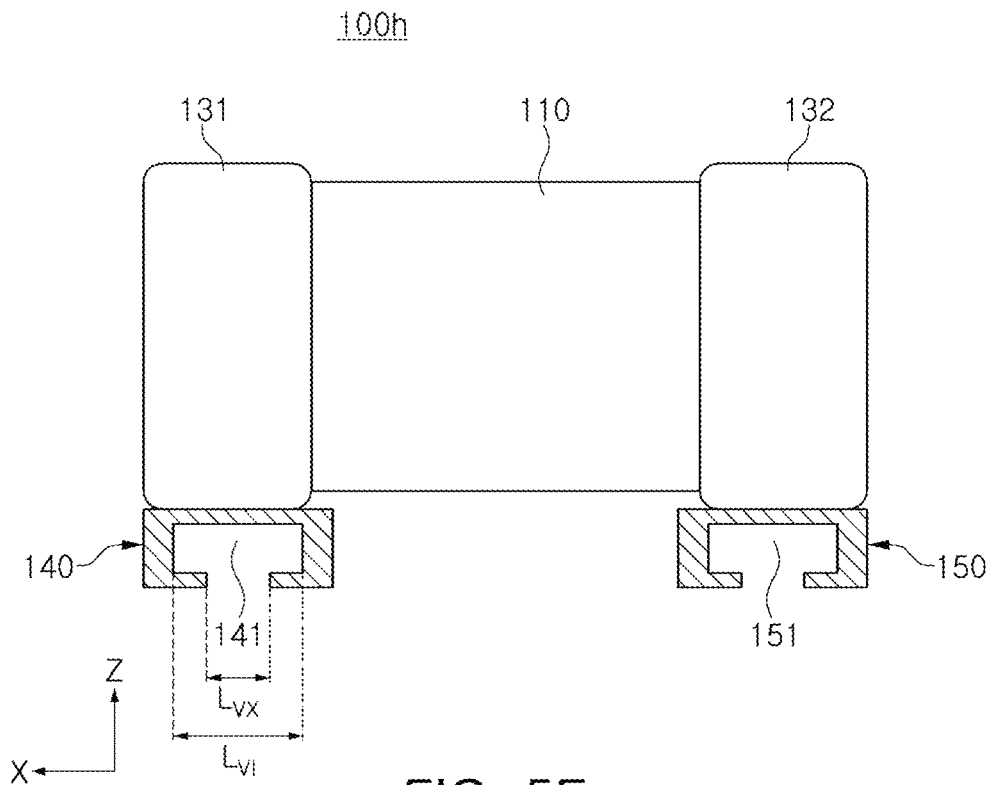
Figure 5F:
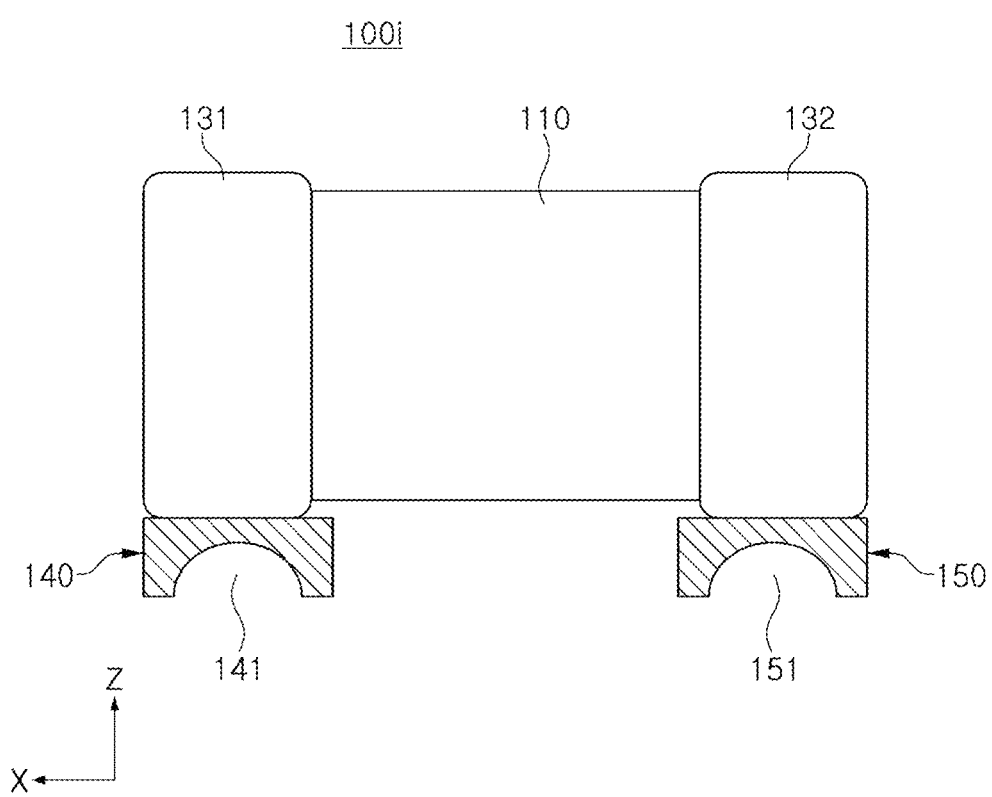
Figure 5G:
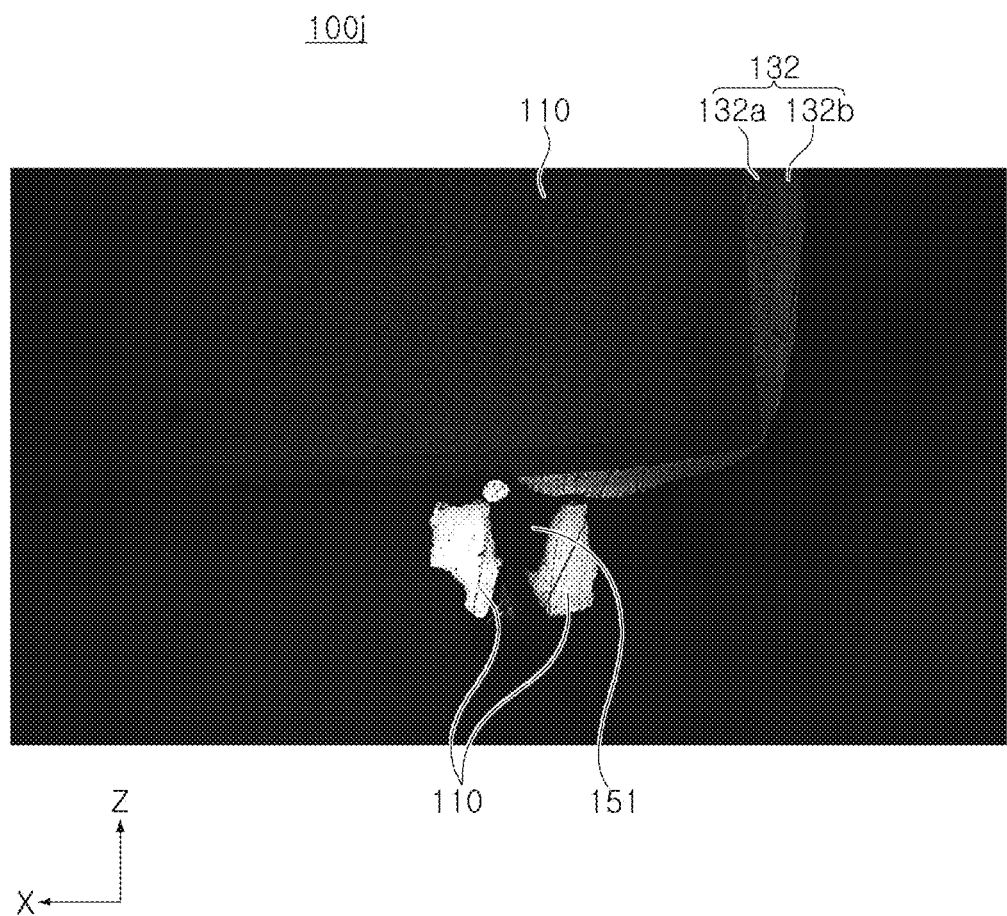

Referring to FIGS. 5A, 5C, and 5G, the at least one hole 141 or 151 of a multilayer capacitor 100d, 100f or 100j according to an exemplary embodiment of the present disclosure may at least partially pass through one surface and the other surface of the first or second bump 140 or 150, and the present disclosure is not limited thereto.

For example, referring to FIGS. 5B, 5D, 5E and 5F, the at least one hole 141 or 151 of the multilayer capacitor 100e, 100g, 100h or 100i according to an exemplary embodiment of the present disclosure may not completely pass through one surface and the opposite surface of the first or second bump 140 or 150. That is, a depth $T_V$ of the at least one hole 141 or 151 may be smaller than a thickness $T_B$ of the first or second bump 140 or 150. For example, the thickness $T_B$ of the first or second bump 140 or 150 may be 150 μm, and the depth $T_V$ of the at least one hole 141 or 151 may be less than 150 μm.

Referring to FIGS. 5C and 5D, a width of the at least one hole 141 or 151 of the multilayer capacitor 100f or 100g according to an exemplary embodiment of the present disclosure may be further increased.

Referring to FIG. 5E, at least some holes classified as the at least one hole 141 or 151 of the multilayer capacitor 100h according to an exemplary embodiment of the present disclosure may each have a central width $L_{VI}$ wider than a width $L_{VX}$ of one end thereof. Accordingly, the at least one hole 141 or 151 may accommodate more solder compared to an average area of the hole, and may have the larger area in contact with the solder, thereby further improving the overall acoustic noise reduction performance and the adhesion strength increase performance.

Referring to FIG. 5F, the inside of the at least one hole 141 or 151 of the multilayer capacitor 100i according to the embodiment of the present disclosure may be round.

Referring to FIG. 5G, the second external electrode 132 of the multilayer capacitor 100j according to an exemplary embodiment of the present disclosure may include a fired layer 132a formed by means of the firing and a plating layer 132b formed by means of the plating, and the first external electrode may also include the same layers.

FIGS. 6A through 6E are plan views each showing a bump of the multilayer capacitor according to an exemplary embodiment of the present disclosure.

Figure 6A:
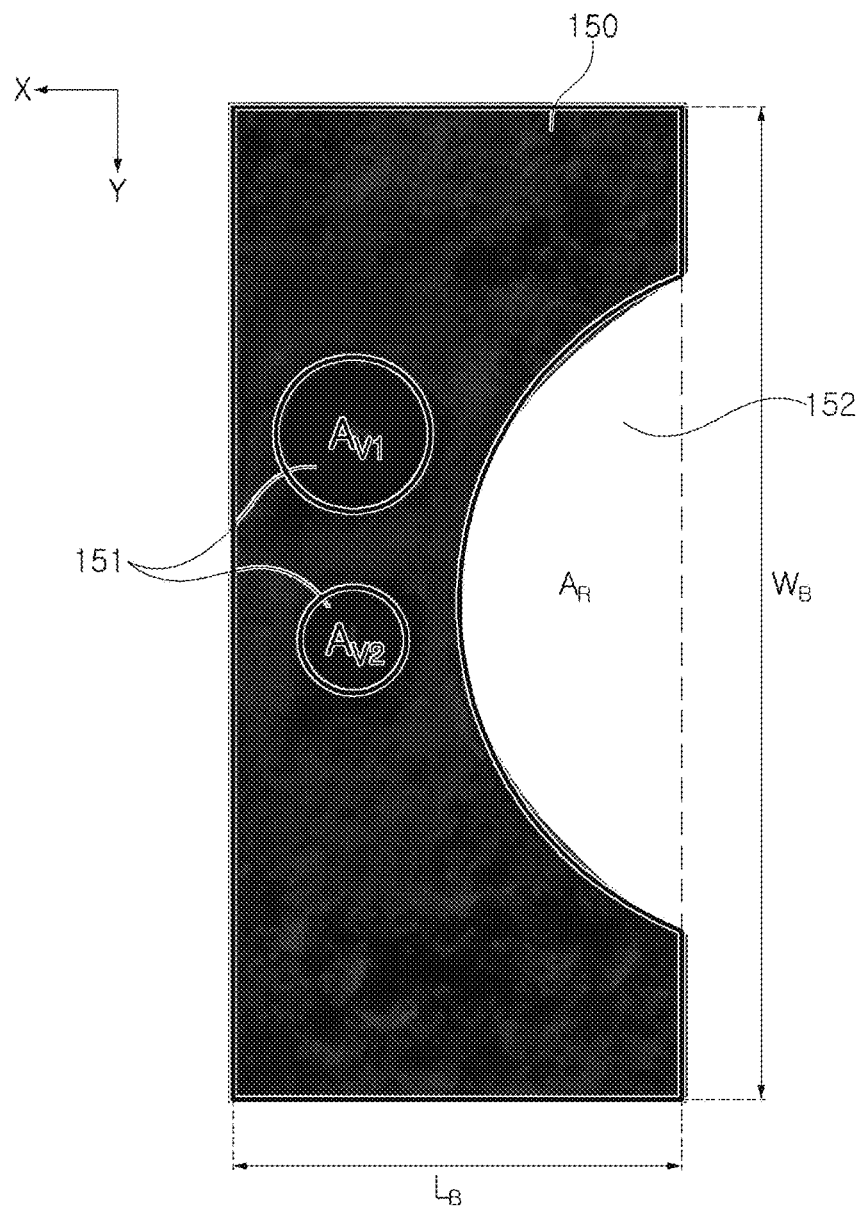
FIGS. 6A through 6E are plan views each showing a bump of the multilayer capacitor according to an exemplary embodiment of the present disclosure.

Referring to FIG. 6A, $A_V$ (see Table 1 below) which is the total area of the at least one hole 151 may be a sum of areas $A_{V1}$ and $A_{V2}$ of the at least one hole 151. For example, $A_V$ which is the sum of the areas $A_{V1}$ and $A_{V2}$ may be smaller than an area $A_R$ of the recess portion 152. The areas $A_{V1}$ and $A_{V2}$ may be measured by obtaining an average width of a vertical thickness of the at least one hole 151 by integrating a horizontal width of the hole 151 in the vertical direction, dividing the obtained value by two (2), squaring the value, and then multiplying the same by the pi (π), based on a vertical section of the bump, exposed by cutting or grinding the bump in a vertical plane. The area $A_R$ below may be measured in a similar manner.

For example, the length $L_B$, width $W_B$, area $A_R$ and areas $A_{V1}$ and $A_{V2}$ may be measured using at least one of the transmission electron microscopy (TEM), the atomic force microscope (AFM), the scanning electron microscope (SEM), the optical microscope and the surface profiler.

The area of the second bump 150 may have a value obtained by subtracting the area $A_R$ of the recess portion 152 from a value obtained by multiplying the length $L_B$ and the width $W_B$ of the second bump 150. The area of the first bump may also be calculated in the same manner, and the length $L_B$, width $W_B$ and the area $A_R$ may each have a value obtained by dividing the sum of each of those of the first and second bumps by two (2).

$A_B$ shown in Table 1 below may have a value obtained by calculating the area with the values divided by two (2), and then multiplying the same by two (2). An s-hole may indicate a hole whose radius is smaller than the depth (e.g. 150 μm) of the hole, an l-hole may indicate a hole whose radius is greater than the depth, and an m-hole may indicate a hole whose radius and depth have sizes similar to each other. The acoustic noise may be reduced as $A_V/A_B$ is higher, and a reduced amount of the acoustic noise compared to unit change of $A_V/A_B$ may be relatively close to a constant compared to the adhesion strength.

An effect of the adhesion strength based on a relationship between the radius and depth of the hole (or the area of one hole) may be smaller than an effect of the adhesion strength based on $A_V/A_B$, and as a variable of the adhesion strength, $A_V/A_B$ may thus be considered preferentially over the relationship between the radius and depth of the hole. For example, adhesion strength of sample 3 may be slightly increased when the s-hole of sample 3 is changed to the m-hole or the l-hole, and may have a value similar to the adhesion strength of sample 2 having the m-hole or that of sample 4 having the l-hole. For example, the adhesion strength of sample 2 may be slightly reduced when the m-hole of sample 2 is changed to the s-hole, and may have a value similar to that of sample 3 having the s hole. For example, the adhesion strength of sample 6 may be slightly reduced when the l-hole of sample 6 is changed to the s-hole, and may have a value similar to or slightly higher than that of sample 3 having the s-hole.

Figure 6B:
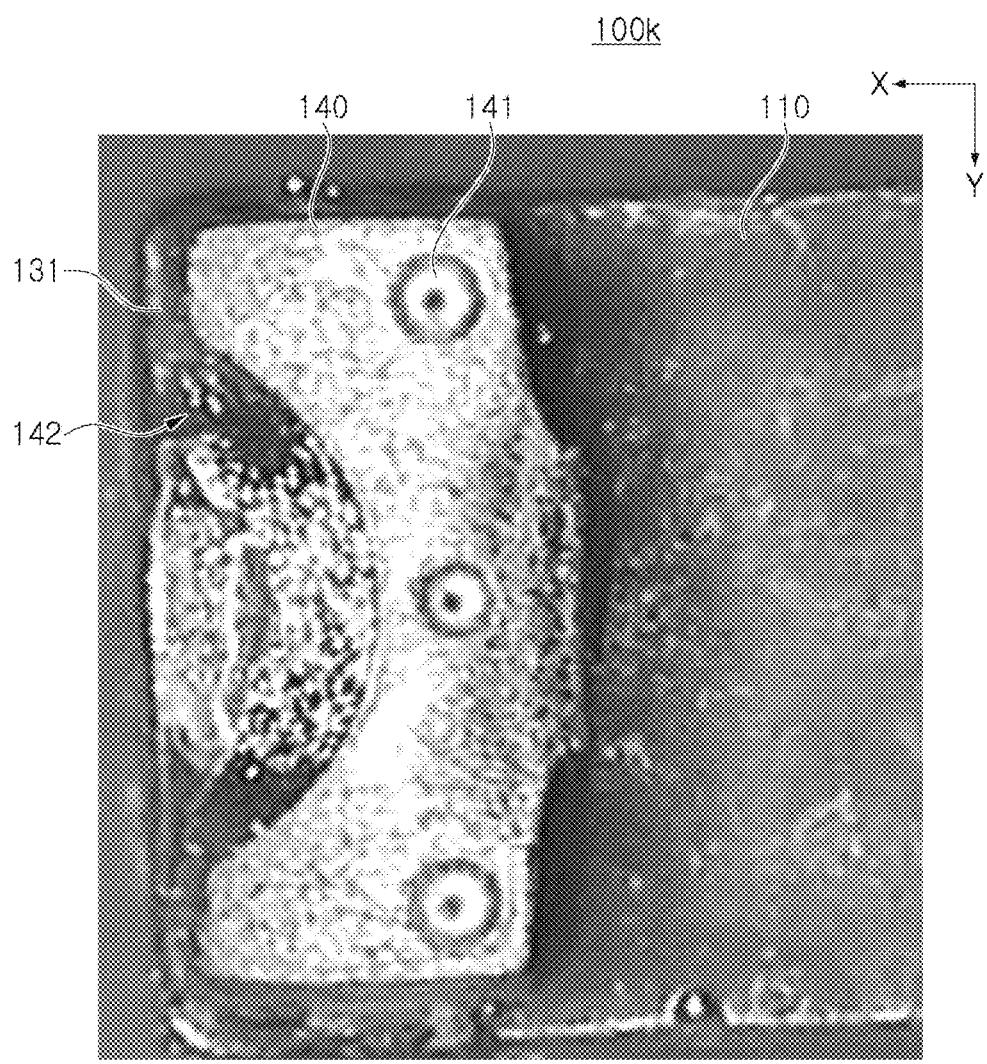
Figure 6C:
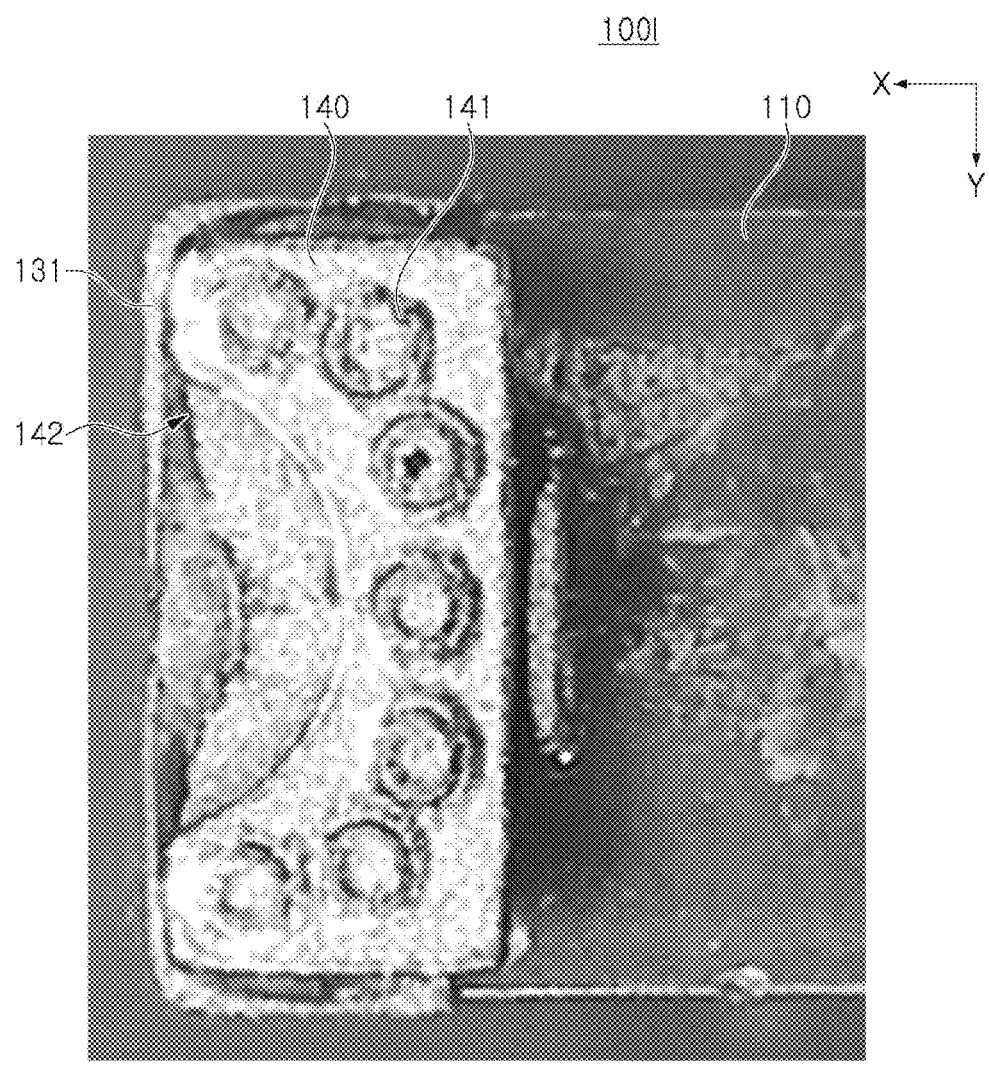
Figure 6D:
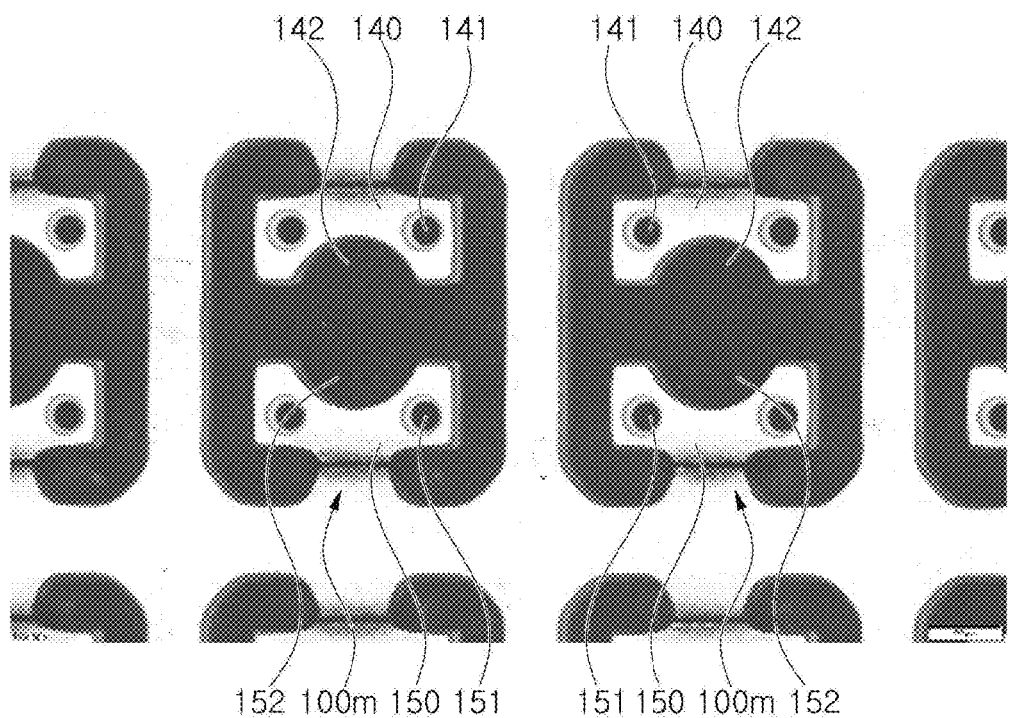

FIGS. 6B, 6C and 6D respectively show sample 1, sample 3 and sample 2 of Table 1 below. That is, the hole 141 of FIGS. 6B and 6C may be the s-hole, the hole 141 or 151 of FIG. 6D may be the m-hole, and an area of the l-hole may be greater than areas $A_{V3}$ and $A_{V4}$ of the hole 141 or 151 of FIGS. 6D and 6E.

TABLE 1

| Sample No. | $A_B$ (mm²) | Number of Holes | $A_V$ (mm²) | $A_V/A_B$ | Adhesion Strength (N) |
|---|---|---|---|---|---|
| 0 | 2.59 | 0 | 0.000 | 0.000 | 13.77 |
| 1 | 2.59 | 3 (s) | 0.032 | 0.012 | 15.56 |
| 2 | 2.56 | 2 (m) | 0.054 | 0.021 | 23.66 |
| 3 | 2.58 | 7 (s) | 0.085 | 0.033 | 21.13 |
| 4 | 2.32 | 1 (l) | 0.117 | 0.050 | 23.67 |

TABLE 1-continued

| Sample No. | $A_B$ (mm²) | Number of Holes | $A_V$ (mm²) | $A_V/A_B$ | Adhesion Strength (N) |
|---|---|---|---|---|---|
| 5 | 2.59 | 2 (l) | 0.288 | 0.111 | 23.25 |
| 6 | 2.53 | 4 (l) | 0.333 | 0.132 | 26.91 |
| 7 | 2.41 | 5 (l) | 0.455 | 0.189 | 7.78 |
| 8 | 2.35 | 5 (l) | 0.464 | 0.198 | 4.55 |

Referring to Table 1, in sample 2 than in sample 1, increase in the adhesion strength may be large compared to increase in a unit of $A_V$, and the bump having $A_V/A_B$ higher than $A_V/A_B$ of sample 1 may thus efficiently provide the acoustic noise reduction performance and the adhesion strength increase performance.

Referring to Table 1, in sample 7 than in sample 6, the adhesion strength may be reduced as the $A_V$ is increased, and the bump having $A_V/A_B$ lower than $A_V/A_B$ of sample 7 may thus efficiently provide the acoustic noise reduction performance and the adhesion strength increase performance.

Accordingly, $A_V/A_B$ of the first and second bumps of the multilayer capacitor according to an exemplary embodiment of the present disclosure may be greater than 0.012 and less than 0.189, and may thus efficiently provide the acoustic noise reduction performance and the adhesion strength increase performance.

In addition, $A_V/A_B$ of each of the first and second bumps of the multilayer capacitor according to an exemplary embodiment of the present disclosure may be equal to or greater than 0.021 which is $A_V/A_B$ of sample 2, and equal to or less than 0.132 which is $A_V/A_B$ of sample 6. Accordingly, it is possible to more stably secure the acoustic noise reduction performance and the adhesion strength increase performance.

Depending on the design, at least two of the s-hole, m-hole and l-hole of Table 1 may be mixed with each other in each of the first and second bumps. For example, each radius of some holes classified as the at least one hole 151 may be smaller than each thickness (e.g., 150 μm) of the first and second bumps, and each radius of the other holes classified as the at least one hole 151 may be equal to or larger than each thickness of the first and second bumps.

Figure 6E:
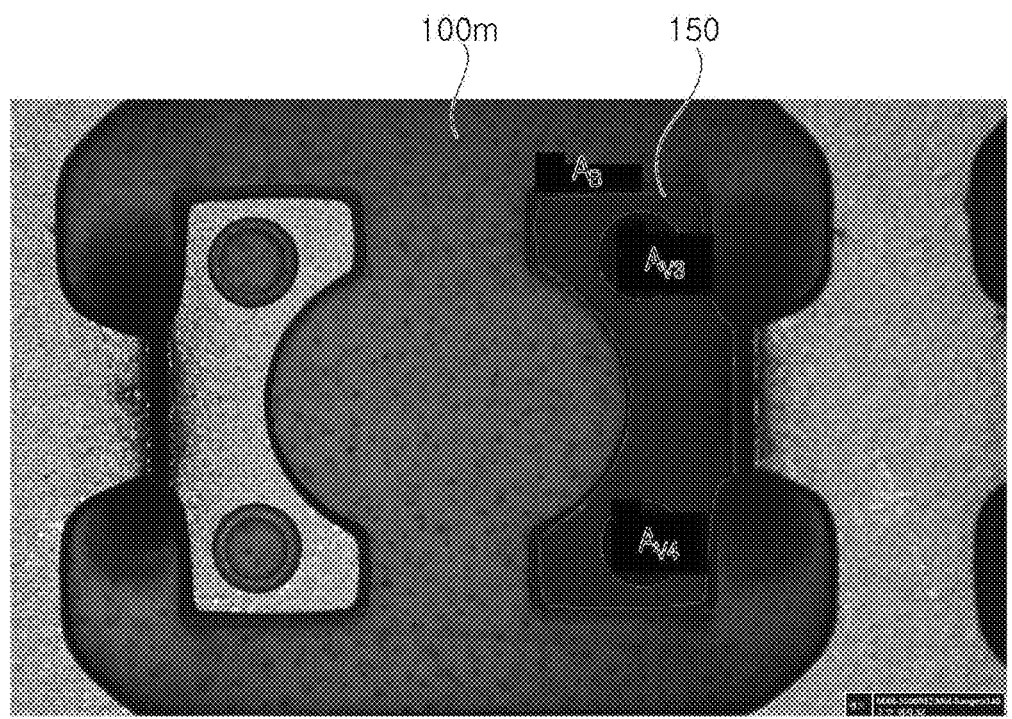

Referring to FIGS. 6D and 6E, a multilayer capacitor 100m according to an exemplary embodiment of the present disclosure may include the recess portion 142 of the first bump 140 and the recess portion 152 of the second bump 150, respectively formed on the first and second bumps 140 and 150 to face each other. For example, the areas $A_{V3}$ and $A_{V4}$ of the at least one hole 141 or 151 and the area $A_B$ of the first or second bump 140 or 150 may be measured in the same manner as the areas $A_{V1}$ and $A_{V2}$ of FIG. 6A.

Figure 7:
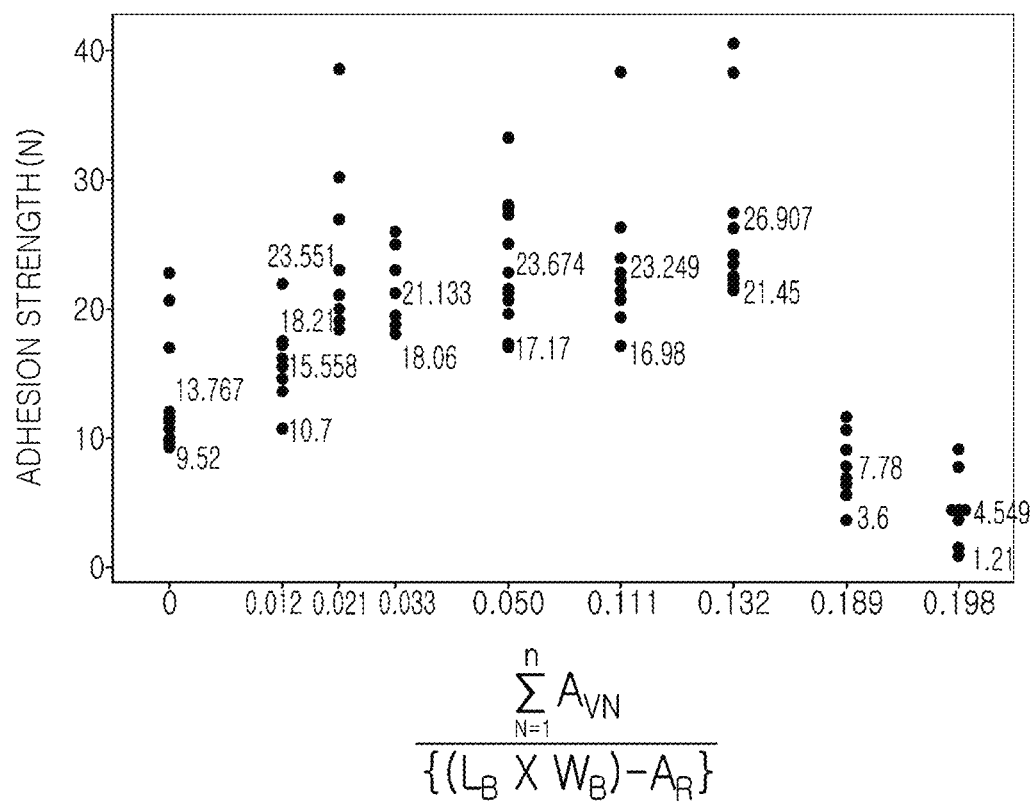
FIG. 7 is a graph showing adhesion strength of the multilayer capacitor, based on a hole/bump area ratio of the capacitor according to an exemplary embodiment of the present disclosure.

FIG. 7 is a graph showing adhesion strength of the multilayer capacitor, based on a hole/bump area ratio of the capacitor according to an exemplary embodiment of the present disclosure.

A horizontal axis of FIG. 7 may be $A_V/A_B$, and may be calculated based on length $L_B$, width $W_B$, area $A_R$, and areas $A_{V1}$ and $A_{V2}$ of FIG. 6A. An average value of a vertical axis of FIG. 7 may be the same as the adhesion strength of Table 1. Each value of FIG. 7 may be organized into Tables 2 and 3 below.

TABLE 2

| Ref | | 1 | | 2 | | 3 | | 4 | |
|---|---|---|---|---|---|---|---|---|---|
| N | FH [N] | N | FH [N] | N | FH [N] | N | FH [N] | N | FH [N] |
| 1 | 11.42 | 1 | 14.56 | 1 | 18.71 | 1 | 19.52 | 1 | 27.25 |
| 2 | 11.85 | 2 | 14.69 | 2 | 23.01 | 2 | 18.06 | 2 | 22.74 |
| 3 | 20.65 | 3 | 16.19 | 3 | 19.77 | 3 | 22.94 | 3 | 19.67 |
| 4 | 11.65 | 4 | 21.96 | 4 | 37.41 | 4 | 18.45 | 4 | 21.32 |
| 5 | 9.52 | 5 | 13.57 | 5 | 26.5 | 5 | 22.9 | 5 | 25.05 |
| 6 | 16.99 | 6 | 13.73 | 6 | 18.21 | 6 | 18.07 | 6 | 27.92 |
| 7 | 12.04 | 7 | 17.11 | 7 | 19.99 | 7 | 25.9 | 7 | 17.17 |
| 8 | 9.88 | 8 | 17.44 | 8 | 21.21 | 8 | 25 | 8 | 21.52 |
| 9 | 10.82 | 9 | 15.63 | 9 | 23.17 | 9 | 21.2 | 9 | 33.33 |
| 10 | 22.85 | 10 | 10.7 | 10 | 28.63 | 10 | 19.29 | 10 | 20.77 |

TABLE 3

| Ref | | 5 | | 6 | | 7 | | 8 | |
|---|---|---|---|---|---|---|---|---|---|
| N | FH [N] | N | FH [N] | N | FH [N] | N | FH [N] | N | FH [N] |
| 1 | 11.42 | 1 | 21.98 | 1 | 27.24 | 1 | 7.65 | 1 | 1.48 |
| 2 | 11.85 | 2 | 21.41 | 2 | 40.35 | 2 | 9.12 | 2 | 4.53 |
| 3 | 20.65 | 3 | 26.26 | 3 | 26.19 | 3 | 3.6 | 3 | 4.72 |
| 4 | 11.65 | 4 | 21.08 | 4 | 23.44 | 4 | 10.83 | 4 | 7.85 |
| 5 | 9.52 | 5 | 19.4 | 5 | 21.45 | 5 | 5.72 | 5 | 4.18 |
| 6 | 16.99 | 6 | 23.77 | 6 | 38.15 | 6 | 6.95 | 6 | 1.21 |
| 7 | 12.04 | 7 | 20.74 | 7 | 23.67 | 7 | 7.81 | 7 | 3.65 |
| 8 | 9.88 | 8 | 38.23 | 8 | 22.47 | 8 | 6.52 | 8 | 9.12 |
| 9 | 10.82 | 9 | 16.98 | 9 | 21.99 | 9 | 7.9 | 9 | 4.53 |
| 10 | 22.85 | 10 | 22.64 | 10 | 24.12 | 10 | 11.7 | 10 | 4.22 |

A first row of each of Tables 2 and 3 may indicate a sample number of Table 1, "N" shown in each of Tables 2 and 3 may indicate a production number for each sample number, and FH may indicate adhesion strength for each production number. That is, Tables 2 and 3 respectively show adhesion strengths for a total of ninety production numbers.

FIGS. 8A through 8D are views each showing a process of obtaining a value of the graph of FIG. 7.

Figure 8A:
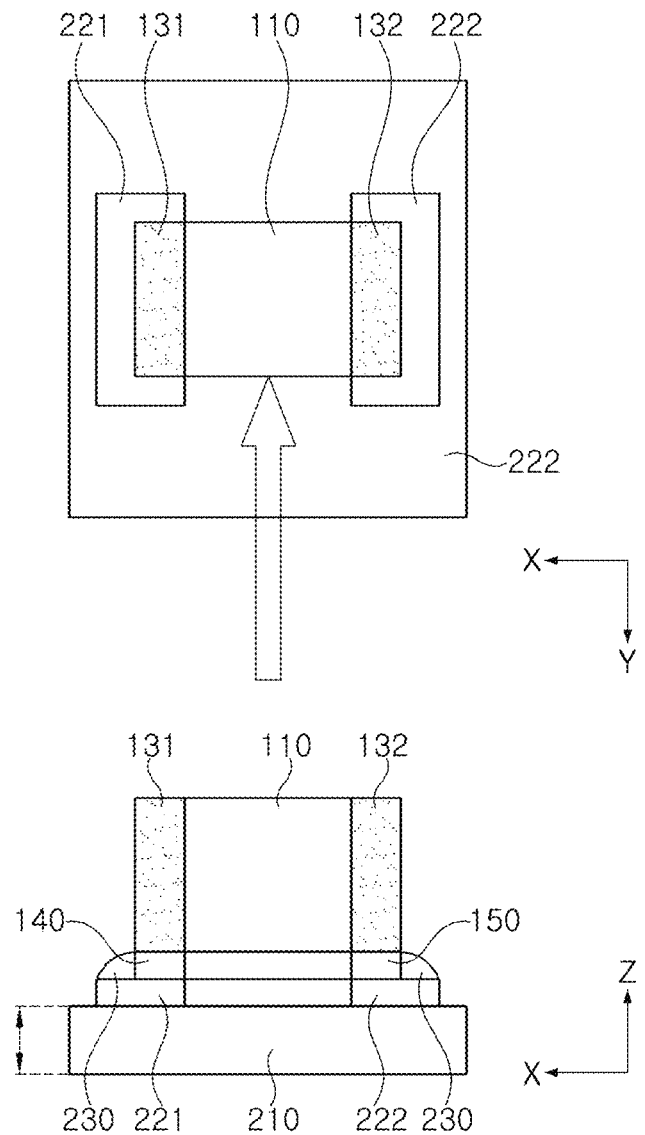
FIGS. 8A through 8D are views each showing a process of obtaining a value of the graph of FIG. 7.

Referring to FIG. 8A, the multilayer capacitor, which includes the body 110 and the first and second external electrodes 131 and 132, may be mounted on first and second pads 221 and 222 of a board 210 through a solder 230, and the first and second bumps 140 and 150 may respectively be disposed between the first and second external electrodes 131 and 132 and the first and second pads 221 and 222.

An external force may be applied to a center of the body in a direction (e.g., Y-direction) perpendicular to both the direction (e.g., Z-direction) in which the multilayer capacitor is mounted and the direction (e.g., X-direction) in which the first and second external electrodes 131 and 132 face each other, and may become linearly stronger as time elapses. A velocity of the external force may be 1.0 mm/sec.

Here, after being applied to the multilayer capacitor, the external force at a moment when the multilayer capacitor is separated or destroyed from the board 210 or the first and second pads 221 and 222 may be the adhesion strength of the multilayer capacitor.

For example, the board 210 may have an area of 100 mm*40 mm and a thickness of 1.6 mm, may use an insulating material of FR4, and may be a single-sided board.

Figure 8B:
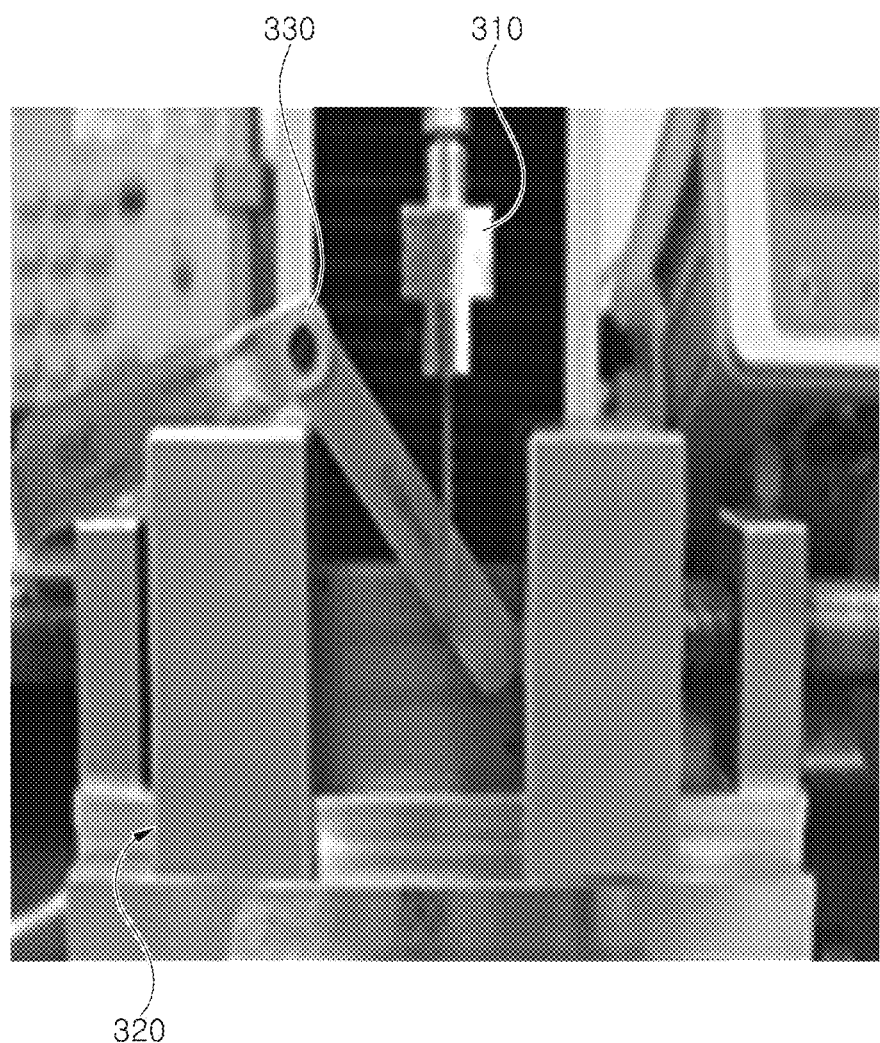
Figure 8C:
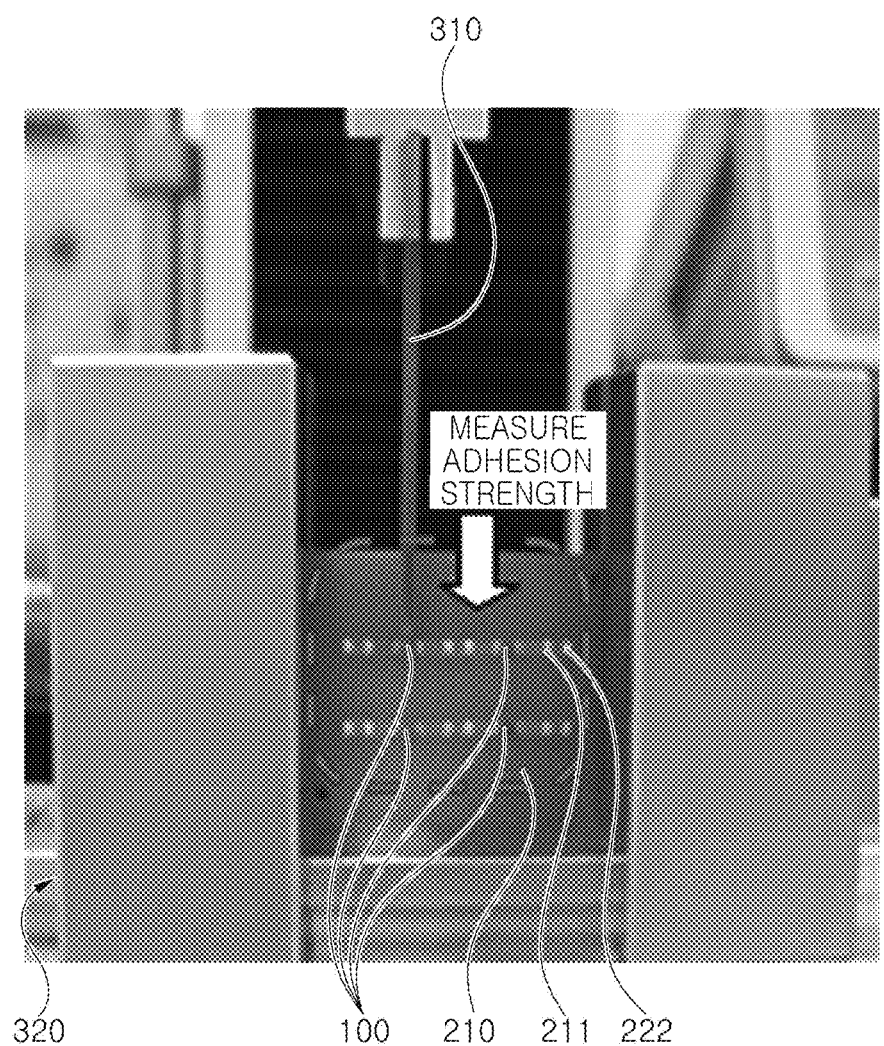
Figure 8D:
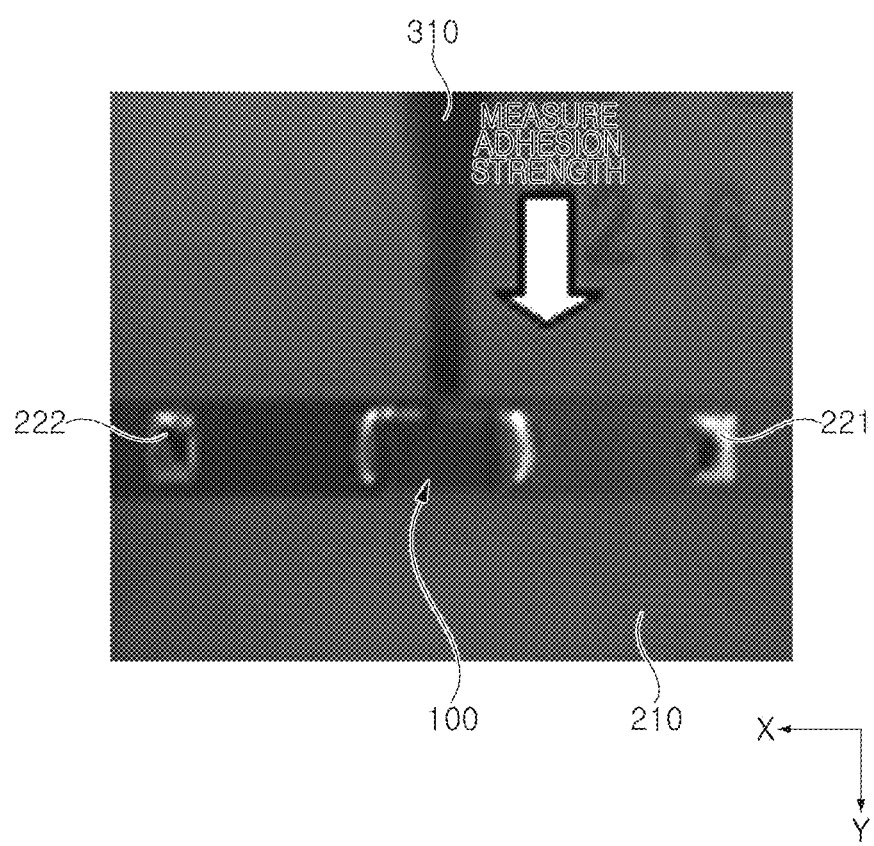

Referring to FIGS. 8B through 8D, the board 210 may be disposed on a support portion 320 whose distance is adjusted by a distance adjustment portion 330, the multilayer capacitor 100 may be mounted on at least a portion of each of the first and second pads 221 and 222, and an external force applying device 310 may measure the adhesion strength of the multilayer capacitor 100 by applying a force to the capacitor. For example, the external force applying device 310, the support portion 320, and the distance adjustment portion 330 may be included in a universal testing machine TIRA.

As set forth above, the multilayer capacitor according to an exemplary embodiment of the present disclosure may have the improved efficiency (e.g., minimized acoustic noise or improved adhesion strength) of the connection structure with respect to another structure (e.g., board or electronic device/electric device) connected thereto.

While the exemplary embodiments have been shown and described above, it will be apparent to those skilled in the art that modifications and variations could be made without departing from the scope of the present disclosure as defined by the appended claims.

What is claimed is:

1. A multilayer capacitor comprising:
    a body including a stack structure in which at least one first internal electrode and at least one second internal electrode are alternately stacked on each other having at least one dielectric layer interposed therebetween in a first direction;
    first and second external electrodes disposed on the body while being spaced apart from each other to be respectively connected to the at least one first internal electrode and the at least one second internal electrode; and
    first and second bumps respectively having one surface disposed on the first or second external electrode and including at least one hole positioned in the one surface or the other surface,
    wherein:
    a depth of the at least one hole is same as or smaller than a thickness of the first bump or the second bump,
    the first and second bumps include a metal material,
    $A_V$ indicates a total area of the at least one hole,
    $A_B$ indicates an area of the one surface of the first or second bump, facing the first or second external electrode, and
    $A_V/A_B$ is greater than 0.012 and less than 0.189.

2. The multilayer capacitor of claim 1, wherein $A_V/A_B$ is equal to or greater than 0.021 and equal to or less than 0.132.

3. The multilayer capacitor of claim 1, wherein a surface of the body, on which the at least one first internal electrode or the at least one second internal electrode is connected to the first or second external electrode, is not parallel to the one surface of the first or second bump.

4. The multilayer capacitor of claim 1, wherein the first and second bumps each include copper (Cu), and
    the at least one hole is configured to accommodate a solder having a melting point lower than copper (Cu).

5. The multilayer capacitor of claim 1, wherein a space positioned between the first and second bumps includes air.

6. The multilayer capacitor of claim 1, wherein the at least one hole at least partially passes through the one surface and the other surface of the first or second bump.

7. The multilayer capacitor of claim 1, wherein the first and second bumps each include two or more holes classified as the at least one hole.

8. The multilayer capacitor of claim 1, wherein at least one hole is positioned to be biased from a center of the first or second bump in a direction in which the holes face each other.

9. The multilayer capacitor of claim 1, wherein the first and second bumps each include a recess portion recessed in a direction different from a direction in which the one surface of the first or second bump and the other surface of the first or second bump face each other, and
    $A_B$ has a value obtained by subtracting $A_R$ from a value obtained by multiplying $L_B$ and $W_B$ and then multiplying the same by two (2) in which $A_R$ has a value obtained by dividing a total area of the recess portion by two (2), $L_B$ has a value obtained by dividing a sum of respective lengths of the first and second bumps by two (2), and $W_B$ has a value obtained by dividing a sum of respective widths of the first and second bumps by two (2).

10. The multilayer capacitor of claim 9, wherein $A_V$ is smaller than $A_R$.

11. The multilayer capacitor of claim 1, wherein the depth of the at least one hole is smaller than the thickness of the first bump or the second bump.

12. A multilayer capacitor comprising:
    a body including a stack structure in which at least one first internal electrode and at least one second internal electrode are alternately stacked on each other having at least one dielectric layer interposed therebetween in a first direction;
    first and second external electrodes disposed on the body while being spaced apart from each other to be respectively connected to the at least one first internal electrode and the at least one second internal electrode; and
    first and second bumps respectively having one surface disposed on the first or second external electrode and including at least one hole positioned in the one surface or the other surface,
    wherein:
    the first bump, the second bump, or both, include a wall that surrounds an entirety of a perimeter of the at least one hole,
    the first and second bumps include a metal material,
    the first and second bumps each include a recess portion recessed in a direction different from a direction in which the one surface of the first or second bump and the other surface of the first or second bump face each other, and
    a total area of the at least one hole is smaller than a total area of the recess portion.

13. The multilayer capacitor of claim 12, wherein a surface of the body, on which the at least one first internal electrode or the at least one second internal electrode is connected to the first or second external electrode, is not parallel to the one surface of the first or second bump.

14. The multilayer capacitor of claim 12, wherein the first and second bumps each include copper (Cu), and
    a space positioned between the first and second bumps includes air.

15. The multilayer capacitor of claim 12, wherein the first and second bumps each include two or more holes classified as the at least one hole, and
    the two or more holes at least partially pass through the one surface and the other surface of the first or second bump, respectively.

16. The multilayer capacitor of claim 15, wherein each radius of some holes classified as the at least one hole is smaller than each thickness of the first and second bumps, and each radius of the other holes classified as the at least one hole is equal to or larger than each thickness of the first and second bumps.

17. The multilayer capacitor of claim 16, wherein some holes classified as the at least one hole each have a central width wider than a width of one end thereof.

18. A multilayer capacitor comprising:
a body including a stack structure in which at least one first internal electrode and at least one second internal electrode are alternately stacked on each other having at least one dielectric layer interposed therebetween in a first direction;
first and second external electrodes disposed on the body while being spaced apart from each other to be respectively connected to the at least one first internal electrode and the at least one second internal electrode; and
first and second bumps respectively having one surface disposed on the first or second external electrode and including a plurality of holes positioned in the one surface or the other surface,
wherein each hole is spaced apart from an adjacent hole, and a depth of the plurality of holes is smaller than a thickness of the first or second bump.

19. The multilayer capacitor of claim 18, wherein at least one hole among the plurality of holes has a central axis that is offset from a center of the first or second bump.

20. The multilayer capacitor of claim 19, wherein the central axis is along the first direction.

21. The multilayer capacitor of claim 18, wherein $A_V$ indicates a total area of the plurality of holes,
$A_B$ indicates an area of the one surface of the first or second bump, facing the first or second external electrode, and
$A_V/A_B$ is greater than 0.012 and less than 0.189.

22. The multilayer capacitor of claim 18, wherein the first and second bumps each include a recess portion recessed in a direction orthogonal to the first direction.

* * * * *